(12) United States Patent
Omameuda

(10) Patent No.: US 9,541,845 B2
(45) Date of Patent: Jan. 10, 2017

(54) EXPOSURE METHOD, EXPOSURE APPARATUS, AND METHOD OF MANUFACTURING DEVICE

(71) Applicant: CANON KABUSHIKI KAISHA, Tokyo (JP)

(72) Inventor: Yoshihiro Omameuda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 350 days.

(21) Appl. No.: 13/942,910

(22) Filed: Jul. 16, 2013

(65) Prior Publication Data

US 2014/0036248 A1 Feb. 6, 2014

(30) Foreign Application Priority Data

Jul. 31, 2012 (JP) .................. 2012-170371

(51) Int. Cl.
*G03F 7/20* (2006.01)

(52) U.S. Cl.
CPC ....... *G03F 7/70775* (2013.01); *G03F 7/70475* (2013.01)

(58) Field of Classification Search
CPC .............. G03F 7/70358; G03F 7/70425; G03F 7/70775; G03F 7/70475; G03F 7/70641
See application file for complete search history.

(56) References Cited

U.S. PATENT DOCUMENTS

| | | | | |
|---|---|---|---|---|
| 5,825,043 A | * | 10/1998 | Suwa | 250/548 |
| 6,090,510 A | * | 7/2000 | Tokuda | 430/30 |
| 6,118,515 A | * | 9/2000 | Wakamoto et al. | 355/53 |
| 6,381,004 B1 | * | 4/2002 | Hagiwara et al. | 355/53 |
| 2005/0083501 A1 | * | 4/2005 | Akimoto | 355/53 |
| 2008/0297743 A1 | * | 12/2008 | Arita | 355/27 |
| 2009/0305176 A1 | * | 12/2009 | Hattori | 430/325 |
| 2011/0051108 A1 | * | 3/2011 | Shibazaki | 355/53 |
| 2011/0273686 A1 | * | 11/2011 | Sato | 355/53 |

FOREIGN PATENT DOCUMENTS

| | | |
|---|---|---|
| JP | 2000-003869 A | 1/2000 |
| JP | 2011238707 A | 11/2011 |

OTHER PUBLICATIONS

Office Action issued in Japanese Appln. No. 2012-170371 mailed Jun. 17, 2016.

* cited by examiner

*Primary Examiner* — Steven H Whitesell Gordon

(74) *Attorney, Agent, or Firm* — Rossi, Kimms & McDowell LLP

(57) ABSTRACT

In an exposure method of performing a scan exposure of a substrate, held by a substrate stage, in a first direction for each shot region, a surface position of an exposure area is pre-measured before the exposure area reaches a region, to be irradiated with exposure light, of the substrate, movement of the substrate stage in order to change a shot region to undergo the scan exposure includes first movement in which the substrate stage moves along a curved trajectory, and second movement in which the substrate stage rectilinearly moves in the first direction, and, while the movement of the substrate stage is the first movement, the surface position is pre-measured, and a pre-measure position in a shot region is common among a plurality of shot regions.

12 Claims, 5 Drawing Sheets

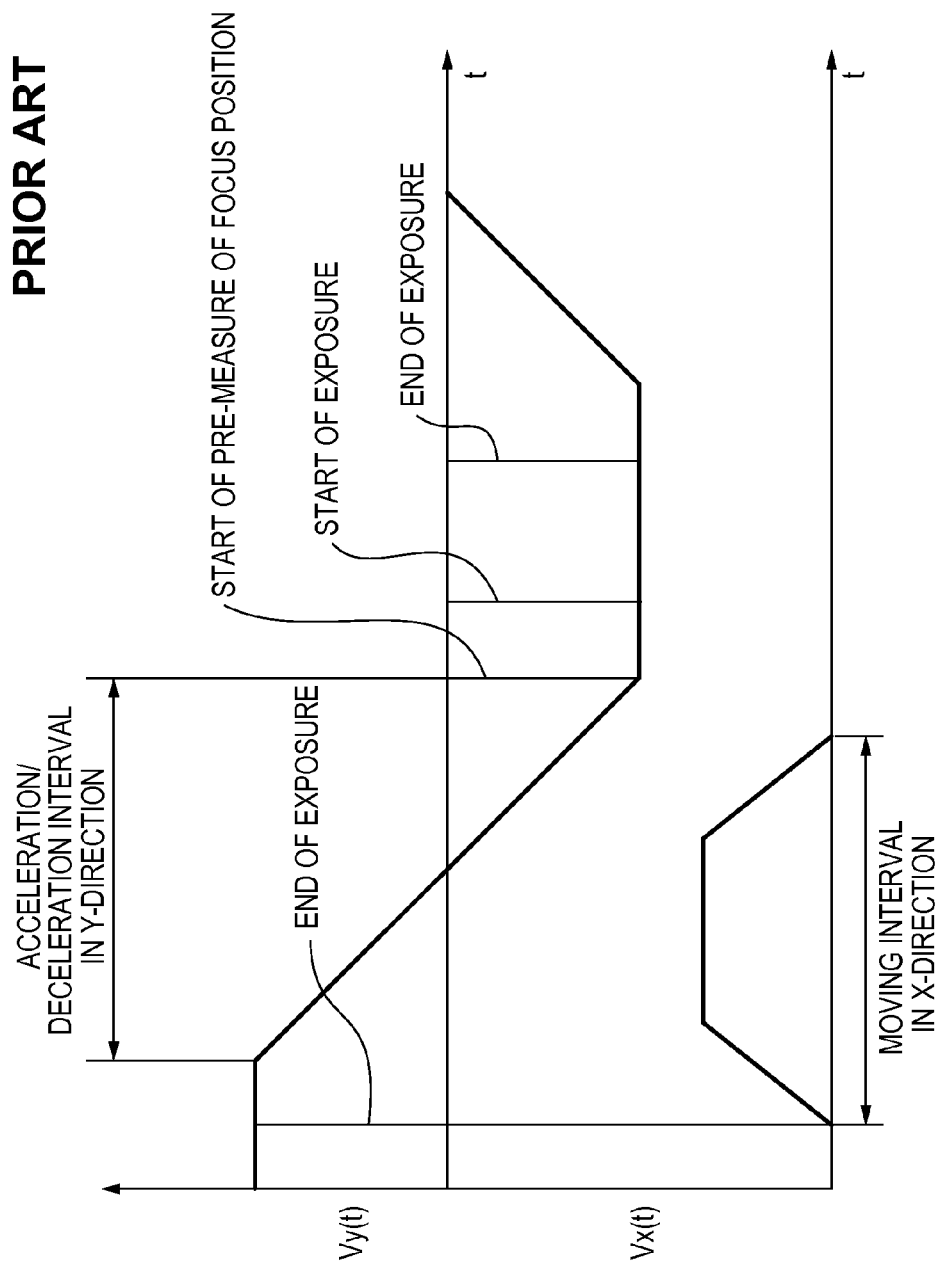

FIG. 4
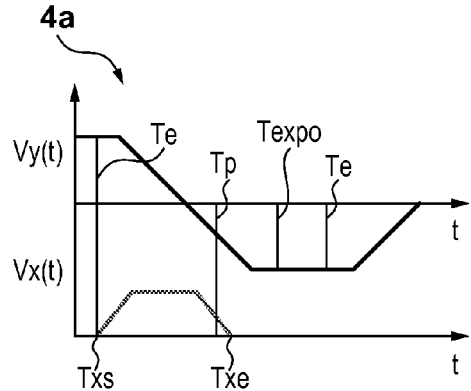
4a
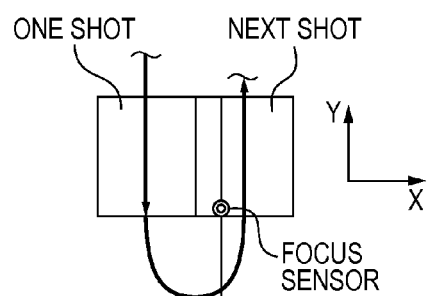
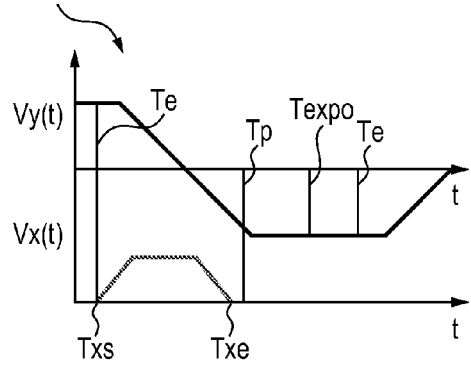
4b
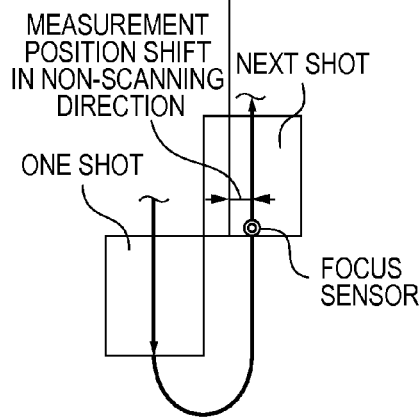
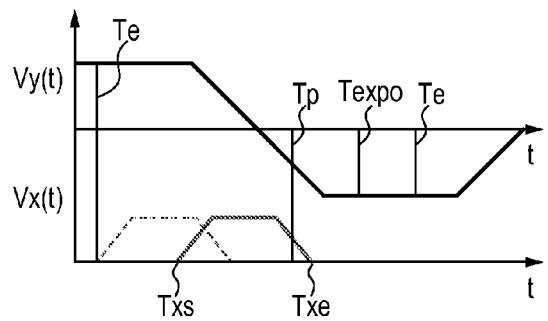
4c
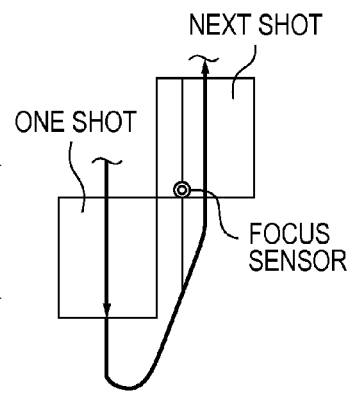

EXPOSURE METHOD, EXPOSURE APPARATUS, AND METHOD OF MANUFACTURING DEVICE

BACKGROUND OF THE INVENTION

Field of the Invention

The present invention relates to an exposure method, an exposure apparatus, and a method of manufacturing a device.

Description of the Related Art

A step-and-scan scanning exposure apparatus which exposes a substrate for each shot region performs step movement of a substrate stage in the non-scanning and scanning directions to the next shot region after exposure in one shot region ends. When the scanning exposure apparatus moves the substrate stage to the position at which exposure in the next shot region starts, it exposes the next shot region while performing scan movement of the substrate stage in the scanning direction. Japanese Patent Laid-Open No. 2000-3869 discloses a scanning exposure apparatus which pre-measures the focus position of an underlayer at an exposure position before the underlayer reaches the exposure position. The scanning exposure apparatus measures the focus position of an area to be exposed, that is, the surface shape of a substrate before exposure in the area to be exposed to adjust the focus position of the area to be exposed before the area to be exposed reaches the exposure position.

Driving of the substrate stage in the non-scanning direction in step movement need only be completed before the start of exposure in the next shot region. However, conventionally, a driving profile in the Y- (scanning) direction is generated so that pre-measure of the focus position starts after completion of step driving in the X- (non-scanning) direction, as shown in FIG. 2. This means that a driving profile is generated so that pre-measure of the focus position can be done at the central position of the shot region in the X- (non-scanning) direction.

Conventionally, because step movement in the X- (non-scanning) direction is performed during the period from the end of exposure in one shot region until pre-measure of the focus position, the time from the end of exposure in this shot region until pre-measure of the focus position is kept long in a driving profile in the Y- (scanning) direction. For example, the constant velocity interval after the end of exposure in one shot region is set long, or the acceleration (deceleration) velocity in the acceleration/deceleration interval is set low in the driving profile in the Y- (scanning) direction. Further, when an exposure process in one shot region ends, step movement in the X- (non-scanning) direction immediately starts.

In the conventional technique, until step movement in the X- (non-scanning) direction ends, pre-measure of the focus position for the next shot region cannot be done, so a long standby time is required before the start of exposure in the next shot region. It is therefore difficult for the scanning exposure apparatus in the conventional technique to obtain a high throughput.

When the positional relationship between one shot region and the next shot region changes, the position in the X- (non-scanning) direction, at which pre-measure of the focus position is performed, may change. In this case, a table representing the detection error of the focus position, which is prepared in advance, cannot be used. Also, when a plurality of types of tables representing the detection errors are prepared in correspondence with a change in pre-measure position of the focus position, the burdens of table generation and maintenance increase.

SUMMARY OF THE INVENTION

The present invention provides a scanning exposure apparatus capable of improving both the accuracy and the throughput.

The present invention in its one aspect provides an exposure method of performing a scan exposure of a substrate, held by a substrate stage, in a first direction for each shot region, wherein a surface position of an exposure area is pre-measured before the exposure area reaches a region, to be irradiated with exposure light, of the substrate, movement of the substrate stage in order to change a shot region to undergo the scan exposure includes first movement in which the substrate stage moves along a curved trajectory, and second movement in which the substrate stage rectilinearly moves in the first direction, and while the movement of the substrate stage is the first movement, the surface position is pre-measured, and a pre-measure position in a shot region is common among a plurality of shot regions.

Further features of the present invention will become apparent from the following description of exemplary embodiments with reference to the attached drawings.

BRIEF DESCRIPTION OF THE DRAWINGS

FIG. 2 is a graph showing the driving profile of a substrate stage in the conventional technique;

FIG. 4 illustrates graphs of another example of the driving profile and trajectory of the substrate stage according to the present invention.

DESCRIPTION OF THE EMBODIMENTS

Configuration of Exposure Apparatus

Figure 1:
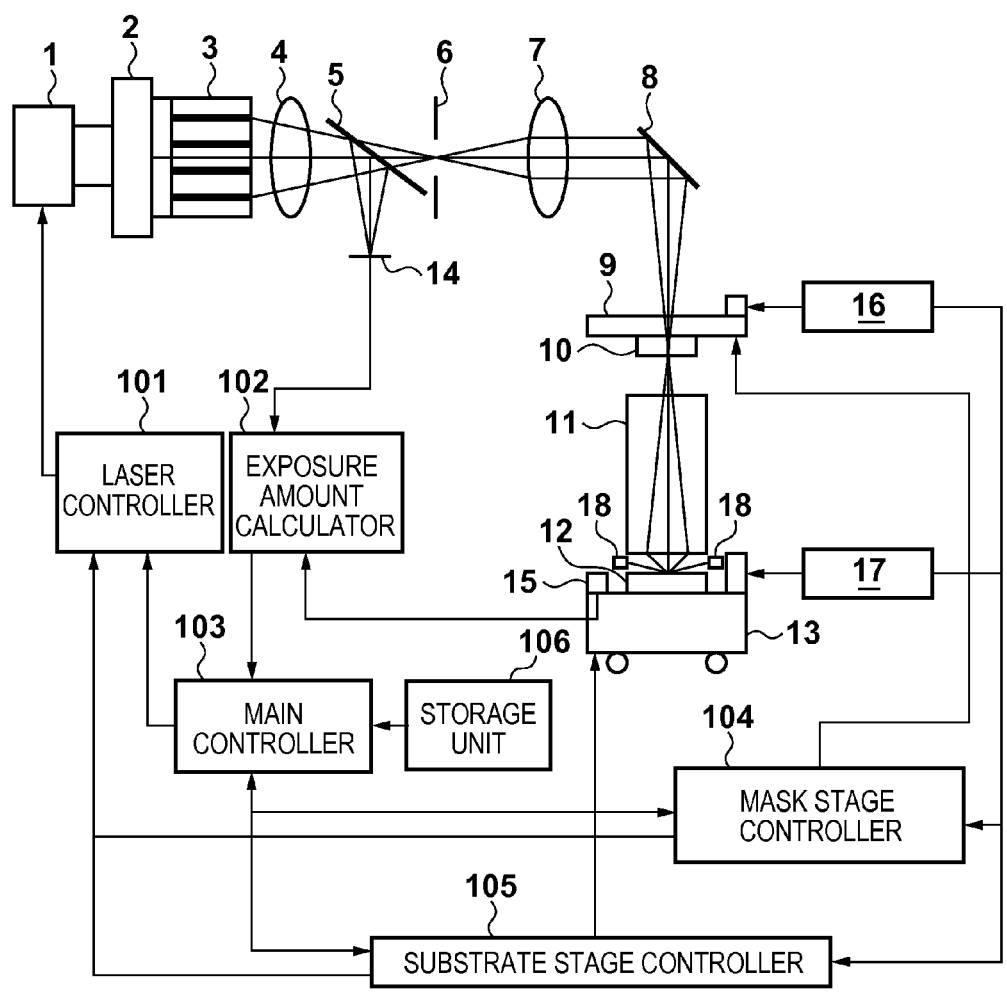
FIG. 1 is a schematic view of a scanning exposure apparatus.

FIG. 1 schematically shows the configuration of a scanning exposure apparatus according to an embodiment of the present invention. A case wherein a pulsed laser such as an excimer laser is used as an exposure light source will be described in this embodiment. A light beam emitted by a light source 1 implemented by a pulsed laser is shaped into a predetermined shape by an optical system 2 which shapes a beam, and is incident on an optical integrator 3. The optical integrator 3 is implemented by, for example, a fly-eye lens formed by a plurality of microlenses, and forms a plurality of secondary light sources near its light exit surface. The light beam emitted by the optical integrator 3 illuminates a movable slit 6 with a variable aperture shape by a condenser lens 4.

A half mirror 5 is arranged between the condenser lens 4 and the movable slit 6. An exposure amount (dose) detector 14 detects the amount of light beam reflected by the half mirror 5, and outputs a signal to an exposure amount calculator 102. The light beam which is transmitted through the half mirror 5, and illuminates the movable slit 6 locally illuminates a circuit pattern, formed on a mask (original) 10 held by a mask stage 9, via an imaging lens 7 and a mirror 8 in a slit shape.

The slit-shaped light beam having passed through the mask 10 reduces and projects by a projection optical system 11 the circuit pattern on the mask 10 onto a substrate (wafer) 12 coated with a photosensitive material (resist). The wafer 12 is held by a substrate stage 13 that can be driven in the X-, Y-, and Z-directions and tilt direction. An exposure amount detector 15 which detects the exposure amount of exposure light that impinges on the substrate stage 13 via the projection optical system 11 is disposed on the substrate stage 13.

Before the start of an exposure operation, the correlation between the exposure amount on the substrate stage 13 detected by the exposure amount detector 15, and that detected by the exposure amount detector 14 is obtained. The exposure amount is controlled during an exposure operation using the exposure amount detected by the exposure amount detector 14. A laser controller 101 outputs a trigger signal and a charging voltage signal in accordance with a desired set exposure amount to control the output energy and oscillation frequency of the light source 1. Also, a light-attenuating unit (not shown) can adjust the amount of light beam from the light source 1.

The distances of the positions of the mask stage 9 and substrate stage 13 are measured by interferometers 16 and 17, respectively. Based on the distance measurement results obtained by the interferometers 16 and 17, a mask stage controller 104 and substrate stage controller 105 are controlled so that the mask stage 9 and substrate stage 13 move in opposite directions at velocities with the same ratio as that of a projection magnification β of the projection optical system 11. At this time, slit light that locally illuminates the mask pattern in a slit shape can sequentially perform a scan exposure of each shot region on the wafer 12 onto which the mask pattern is to be transferred by exposure to transfer the mask pattern onto the wafer 12.

The scanning exposure apparatus has an autofocus mechanism including a focus sensor (detector) 18 which pre-measures (measures) the surface position of a shot region at a reference point before the shot region reaches a region to be irradiated with exposure light (exposure slit). The autofocus mechanism pre-measures the surface position of the shot region at the center or in the vicinity of the shot region of the projection optical system 11 by the focus sensor 18 to adjust the level of the substrate stage 13 so that this surface position coincides with a best focus position.

A main controller 103 reads the mask stage 9, an exposure recipe, and the moving conditions (profile) of the substrate stage 13 corresponding to the exposure recipe from a storage unit 106. The main controller 103 issues commands to the mask stage controller 104 and substrate stage controller 105 to drive the mask stage 9 and substrate stage 13 based on the read profile.

After exposure operations for all desired shot regions on the wafer 12 end, the wafer 12 is conveyed outside the exposure apparatus from the substrate stage 13 through a wafer conveyance system (not shown). At the same time, the next wafer 12 is supplied onto the substrate stage 13 through the wafer conveyance system (not shown). The pattern formed on the next wafer 12, and the exposure slit are then aligned by an alignment system (not shown). The positions of alignment marks formed on the peripheries of a plurality of shot regions selected on the wafer 12 are measured to obtain, for example, offsets of rotation, expansion/contraction, and shift of the wafer 12, thereby positioning all shot regions on the wafer 12. Before fine alignment, as described earlier, rough alignment is often performed to detect the alignment marks. After each shot region is positioned in this way, a scan exposure is repeated for each shot region.

[Moving Profile of Substrate Stage]

Figure 3A:
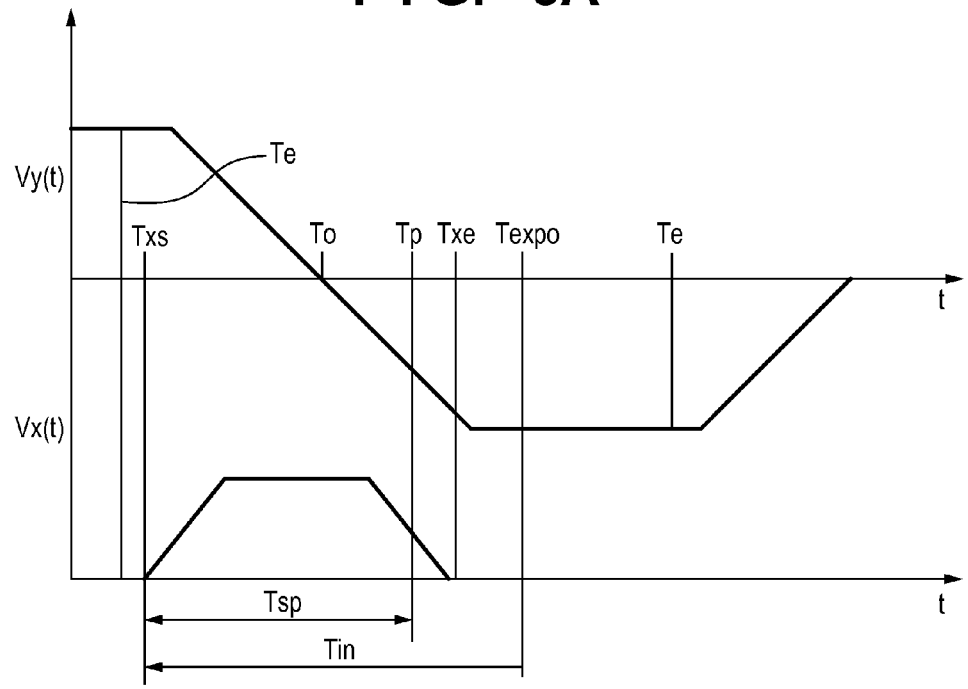
FIG. 3A is a graph illustrating an example of the driving profile of a substrate stage according to the present invention.
Figure 3B:
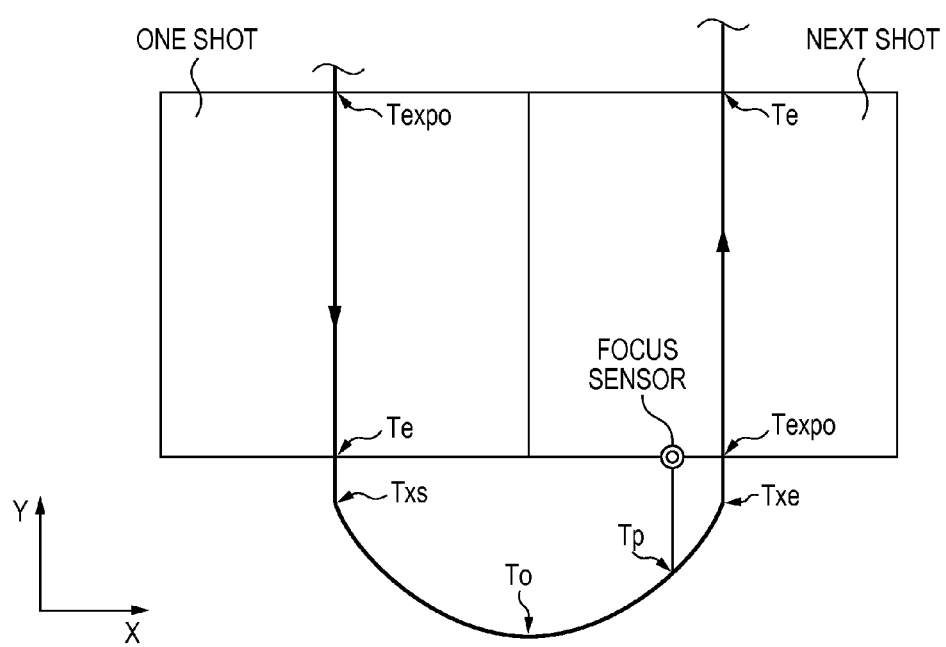
FIG. 3B is a graph illustrating an example of the trajectory of the substrate stage according to the present invention.

FIG. 3A shows the profiles of step movement in which the target for a scan exposure is changed to the next shot region (second shot region) after a scan exposure of one shot region (first shot region) ends, and scan movement of the next shot region. In this embodiment, one shot region and the next shot region are arranged adjacent in a second direction (X-direction) perpendicular to a first direction (Y-direction) at the same position in the first direction, as shown in FIG. 3B. FIG. 3B shows a change (trajectory) in position of the exposure slit relative to the substrate stage 13 when the substrate stage 13 moves relative to the fixed exposure slit during an exposure operation. Note that the mask stage 9 is also driven in synchronism with the substrate stage 13, and is therefore driven in accordance with the same profile as that of the substrate stage 13.

Referring to FIG. 3A, Vy(t) represents the velocity profile of the substrate stage 13 in the Y-(scanning) direction at time t, and Vx(t) represents the velocity profile of the substrate stage 13 in the X- (non-scanning) direction at time t. Also, the respective times at which the velocity profiles in the X- and Y-directions are defined are expressed as:

Texpo: the start time of a scan exposure

Te: the end time of a scan exposure

Tp: the start time of pre-measure of the focus position

To: the time at which the velocity in the Y- (scanning) direction is zero

Txs: the start time of step movement in the X- (non-scanning) direction

Txe: the end time of step movement in the X- (non-scanning) direction

The substrate stage 13 rectilinearly moves in the Y-(scanning) direction during a scan exposure of the shot region, that is, during the period from the time Texpo until the time Te. The substrate stage 13 rectilinearly moves in the Y- (scanning) direction from the time Te until the time Txs and from the time Txe until the time Texpo during step movement (second movement). However, the substrate stage 13 moves in both the X- and Y-directions along a curved trajectory from the time Txs until the time Txe during step movement (first movement).

The start time Txs of movement in the X-direction is determined for the start time Texpo of a scan exposure. The start time Txs of movement in the X-direction is determined to be after the time Te of a scan exposure of one shot region, and a designated time Tin before the start time Texpo of a scan exposure of the next shot region. That is, the start time Txs of movement in the X-direction is determined to satisfy:

$$Txs \geq Te \qquad (1)$$

$$Txs = Texpo - Tin \qquad (2)$$

In the present invention, when step movement is performed between shot regions with movement in the X- (non-scanning) direction, the pre-measure position (measurement position) of the focus position in the next shot region is common among a plurality of shot regions. That is, the position of the center of the exposure slit relative to the substrate stage 13, that is, the shot region at the start of pre-measuring the focus position in the shot region remains the same. That is, letting (Xp, Yp) be the coordinates of the center of the exposure slit at the start time Tp of pre-measure of the focus position, Xp and Yp are known design values, and are set in advance and stored in the storage unit 106. Also, in this embodiment, the velocity profiles of the substrate stage 13 in the X- and Y-directions are known as shown in FIG. 3A, except for the start time Txs of movement in the X-direction.

How to obtain the start time Tp of pre-measure of the focus position will be described first. The focus sensor 18 is spaced apart from the position of the center of the exposure slit by Yf in the Y-direction. Then, the distance across which the substrate stage 13 moves in the Y-direction during the period from the start time Tp of pre-measure of the focus position until the start time Texpo of a scan exposure in the next shot region is defined as Yf. That is, we have:

$$Yf = \int_{Tp}^{Texpo} Vy(t)dt \quad (3)$$

In this embodiment, Yf, Texpo, and Vy(t) are known. It is therefore possible to obtain the start time Tp of pre-measure of the focus position from equation (3).

When the start time Tp of pre-measure of the focus position is determined, the Y-coordinate Yp of the position of the substrate stage 13 at the start time Tp of pre-measure of the focus position is given by:

$$Yp = \int_{To}^{Tp} Vy(t)dt + Yo \quad (4)$$

where Yo is the position of the substrate stage 13 in the Y-direction at the time To at which the velocity in the Y- (scanning) direction is zero.

How to obtain the start time Txs of step movement in the X- (non-scanning) direction using Tp determined using equation (3) will be described below. When the position of the substrate stage 13 in the X- (non-scanning) direction at the start time Txs of step movement in the X-direction is defined as Xxs, the X-coordinate Xp of the position of the substrate stage 13 at the start time Tp of pre-measure of the focus position is given by:

$$Xp = \int_{Txs}^{Tp} Vx(t)dt + Xxs \quad (5)$$

Note that the shapes of the positions Xxs, Tp, Xp, and Vx(t) of the substrate stage 13 in the X- (non-scanning) direction at the start time Txs of step movement in the X-direction are known. It is therefore possible to obtain the start time Txs of step movement in the X- (non-scanning) direction and, in turn, the designated time Tin.

Modification of Driving Control of Substrate Stage

First Modification

In the above-mentioned embodiment, two shot regions are arranged adjacent in the X-direction at the same position in the Y-direction (first arrangement). However, the present invention is also applicable to a case wherein two shot regions are arranged at different positions in the Y-direction (second arrangement). As shown in 4b of FIG. 4, when two shot regions are set at different positions in the Y-direction, assume that the same driving profile as in the case of 4a wherein two shot regions are arranged adjacent in the X-direction at the same position in the Y-direction is used. The amount of movement in the Y- (scanning) direction during step movement between two shot regions in the case of 4b is larger than that in the case of 4a. Therefore, the time from the time Te of a scan exposure in one shot region until the start time Texpo of a scan exposure in the next shot region must be kept longer in the case of 4b than in the case of 4a.

To meet this requirement, the start time Texpo of a scan exposure in the next shot region and, eventually, the start time Tp of pre-measure of the focus position are set later in the case of 4b than in the case of 4a. In this state, the start time Txs of step movement of the substrate stage 13 in the X-direction is determined at the same time as in the case of 4a. Then, as shown in 4b, step movement of the substrate stage 13 in the X- (non-scanning) direction has already ended at the start time Tp of pre-measure of the focus position. As a result, the pre-measure position of the focus position in the case of 4b becomes, for example, the center of the exposure slit, which is shifted from that in the case of 4a.

Upon the separation of two shot regions in the Y-direction, the constant velocity interval in the Y-direction after a scan exposure in one shot region (third shot region) is set longer in the case of 4c than in the case of 4a. The start time Txs and end time Txe of step movement in the X-direction are postponed by a period for which the constant velocity interval in the Y-direction is set longer than in the case of 4a. Therefore, the driving profiles of the substrate stage 13 in the X- and Y-directions during the period from the start time Tp of pre-measure of the focus position until the start time Texpo of a scan exposure in the next shot region (fourth shot region) remain the same between the cases of 4a and 4c of FIG. 4. This means that the pre-measure position of the focus position also remains the same between the cases of 4a and 4c. The start time Tp of pre-measure of the focus position, and the start time Txs of step movement in the X- (non-scanning) direction in the case of 4c can be obtained directly using the method described in the above-mentioned embodiment.

Second Modification

When the distance Yf between the exposure slit and the focus sensor 18 in the Y- (scanning) direction changes, the start time Tp of pre-measure of the focus position changes. However, the start time Tp of pre-measure of the focus position corresponding to changed Yf can be obtained by substituting changed Yf into equation (3). The start time Txs of step movement in the X- (non-scanning) direction corresponding to changed Yf can be obtained by substituting changed Tp into equation (5). Also, the pre-measure position of the focus position can be maintained constant even when Yf is changed.

Third Modification

In the above-mentioned embodiment, to set the substrate stage 13 at a predetermined measurement position (Xp, Yp) at the start time Tp of pre-measure of the focus position, the start time Txs of step movement in the X-direction is set using the shape of a driving profile in the X-direction determined in advance. However, to set the substrate stage 13 at a predetermined measurement position (Xp, Yp) at the start time Tp of pre-measure of the focus position, the driving profile Vx(t) in the X-direction can also be set using the start time Txs of step movement in the X-direction determined in advance. That is, Txs is obtained given Vx(t) in equation (5) in the above-mentioned embodiment, while the driving profile Vx(t) in the X-direction is obtained based on known Txs in equation (3) in the third modification.

Figure 5:
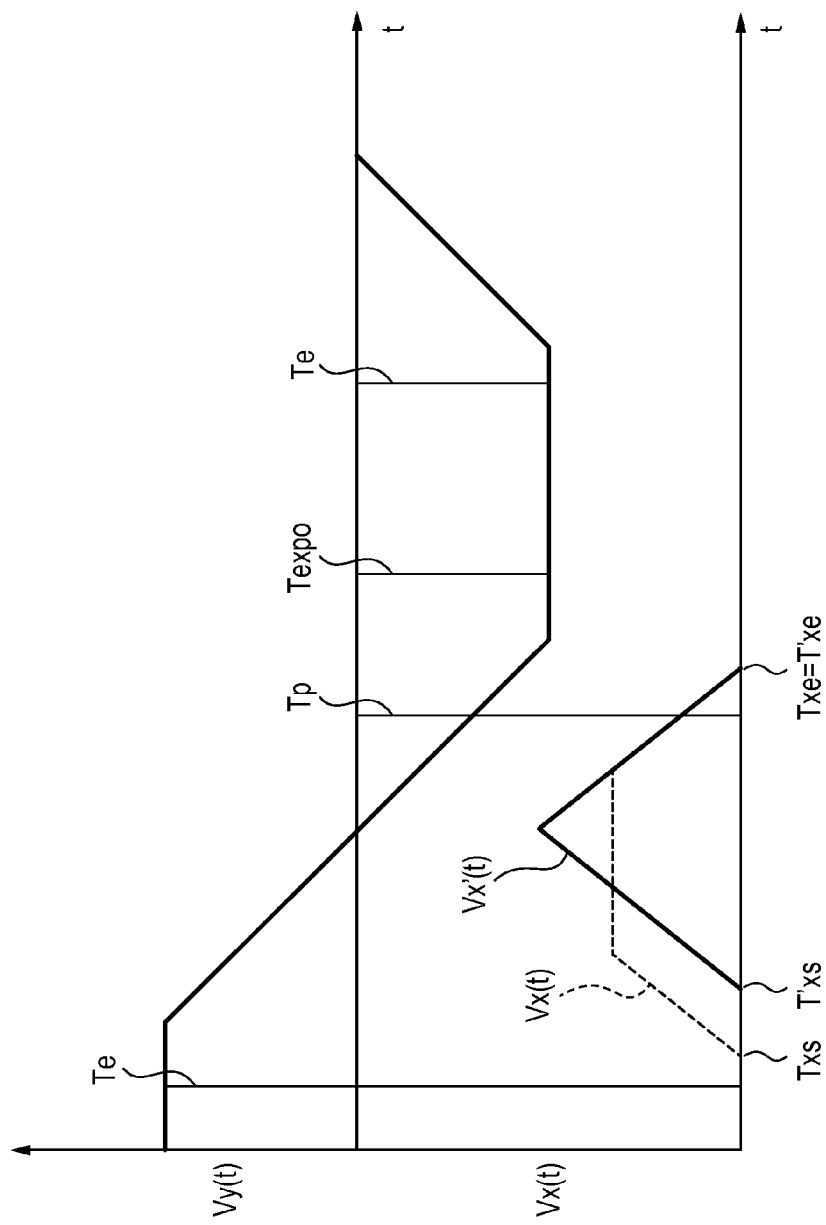
FIG. 5 is a graph illustrating still another example of the driving profile of the substrate stage according to the present invention.

The driving profile Vx(t) in the X-direction of the above-mentioned embodiment shown in FIG. 3A is represented as a trapezoidal shape indicated by a dotted line during the period from time Txs until time Txe in FIG. 5. Assume, for example, that the start time of step movement in the X-direction is determined as T'xs in advance. In this case, when a triangular shape which has a base defined by time T'xs until time T'xe (=Txe) and is indicated by a solid line has the same area as that of a trapezoid (the moving distance in the X-direction) indicated by a dotted line, a driving profile V'x(t) represented as the triangular shape indicated by the solid line may be used. As for the driving profile V'x(t) based on the start time T'xs of step movement in the X-direction, the driving profiles of the substrate stage 13 in the X- and Y-directions during the period from the start time Tp of pre-measure until the start time Texpo of a scan exposure are the same. Therefore, the pre-measure position of a predetermined focus position can also be set using the driving profile V'x(t).

In the above description, the driving profile of the substrate stage 13 is represented as a change over time of velocity. However, a driving profile represented as a change over time of acceleration or jerk of the substrate stage 13 can be used in place of that of velocity.

[Method of Manufacturing Device]

A method of manufacturing a device (for example, a semiconductor device or a liquid crystal display device) will be described next. A semiconductor device is manufactured by a preprocess of forming an integrated circuit on a wafer, and a post-process of completing, as a product, a chip of the integrated circuit formed on the wafer by the preprocess. The preprocess includes a step of exposing a wafer coated with a photosensitive agent to light using the above-mentioned exposure apparatus, and a step of developing the wafer. The post-process includes an assembly step (dicing and bonding) and packaging step (encapsulation). A liquid crystal display device is manufactured by a step of forming a transparent electrode. The step of forming a transparent electrode includes a step of applying a photosensitive agent to a glass substrate on which a transparent conductive film is deposited, a step of exposing the glass substrate coated with the photosensitive agent to light using the above-mentioned exposure apparatus, and a step of developing the glass substrate. The method of manufacturing a device according to this embodiment can manufacture a device with a quality higher than those of a device manufactured by the conventional technique. Although embodiments of the present invention have been described above, the present invention is not limited to these embodiments, and various modifications and changes can be made without departing from the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-170371, filed Jul. 31, 2012, which is hereby incorporated by reference herein in its entirety.

What is claimed is:

1. An exposure method of performing a scan exposure of a substrate, held by a substrate stage, in a first direction for each shot region of the substrate, the method comprising:
   a first scan exposure step of performing a scan exposure of a shot region of the substrate;
   a measuring step of measuring a surface position of a next shot region to undergo a scan exposure after the first scan exposure step while the substrate stage moves in a second direction, which is perpendicular to the first direction; and
   a second scan exposure step of performing the scan exposure of the next shot region based on a measurement result of the measuring step,
   wherein the shot region and the next shot region are arranged at different positions in the first direction and adjacent to each other in the second direction.

2. The method according to claim 1, further comprising:
   a moving step of moving the substrate stage to change a shot region to undergo the scan exposure and includes a first movement in which the substrate stage moves along a curved trajectory and a second movement in which the substrate stage moves rectilinearly in the first direction,
   wherein movement of the substrate stage is measured during the first movement.

3. The method according to claim 1, wherein letting Txs be a time at which the substrate stage starts to move in the second direction, Xxs be a position of the substrate stage in the second direction at the time Txs, Tp be a time at which the surface position starts to be measured in the second shot region, Xp be a position of the substrate stage in the second direction at the time Tp, Texpo be a time at which a scan exposure starts in the second shot region, Yf be an interval in the first direction between the region to be irradiated with the exposure light and a position at which measure of the surface position starts, and Vy(t) and Vx(t) be velocities of the substrate stage in the first direction and the second direction, respectively, Yf, Texpo, Txs, Vy(t), Vx(t), and Xxs are set to satisfy:

$$Yf = \int_{Tp}^{Texpo} Vy(t)dt, \text{ and}$$

$$Xp = \int_{Txs}^{Tp} Vx(t)dt + Xxs.$$

4. An exposure apparatus for performing a scan exposure of a substrate, held by a substrate stage, in a first direction for each shot region of the substrate, the apparatus comprising:
   a detector configured to measure a surface position of a next shot region to undergo a scan exposure after performing a scan exposure of a shot region of the substrate; and
   a controller configured to control movement of the substrate stage in accordance with a profile defining the movement of the substrate stage,
   wherein the detector measures the surface position of the next shot region while the substrate stage moves in a second direction, which is perpendicular to the first direction,
   wherein the controller controls the movement of the substrate stage to perform the scan exposure of the next shot region based on a measurement result of the surface position of the next shot region, and
   wherein the shot region and the next shot region are arranged at different positions in the first direction and adjacent to each other in the second direction.

5. The apparatus according to claim 4, wherein the profile is represented as a change over time of one of a velocity, an acceleration, or a jerk of the substrate stage.

6. An exposure method of performing a scan exposure of a substrate, held by a substrate stage, in a first direction for each shot region of the substrate, the method comprising:
   a first scan exposure step of performing a scan exposure of a first shot region of the substrate;
   a first measuring step of measuring a surface position of a second shot region to undergo a scan exposure after the first scan exposure step while the substrate stage moves in a second direction, which is perpendicular to the first direction;

a second scan exposure step of performing the scan exposure of the second shot region based on a measurement result of the first measuring step;

a third scan exposure step of performing a scan exposure of a third shot region of the substrate;

a second measuring step of measuring a surface position of a fourth shot region to undergo a scan exposure after the third scan exposure step while the substrate stage moves in the second direction; and a fourth scan exposure step of performing the scan exposure of the fourth shot region based on a measurement result of the second measuring step, wherein the first shot region and the second shot region are arranged at an identical position in the first direction and adjacent to each other in the second direction, wherein the third shot region and the fourth shot region are arranged at different positions in the first direction and adjacent to each other in the second direction, and wherein a measurement position of the surface position is common among the second shot region and the fourth shot region.

7. The method according to claim 6, further comprising: a moving step of moving the substrate stage to change a shot region to undergo the scan exposure includes a first movement in which the substrate stage moves along a curved trajectory and a second movement in which the substrate stage moves rectilinearly in the first direction, wherein movement of the substrate stage is measured during the first movement.

8. The method according to claim 6, wherein letting Txs be a time at which the substrate stage starts to move in the second direction, Xxs be a position of the substrate stage in the second direction at the time Txs, Tp be a time at which the surface position starts to be measured in the second shot region or the fourth shot region, Xp be a position of the substrate stage in the second direction at the time Tp, Texpo be a time at which a scan exposure starts in the second shot region or the fourth shot region, Yf be an interval in the first direction between the region to be irradiated with the exposure light and a position at which measure of the surface position starts, and Vy(t) and Vx(t) be velocities of the substrate stage in the first direction and the second direction, respectively, Yf, Texpo, Txs, Vy(t), Vx(t), and Xxs are set to satisfy:

$$Yf = \int_{Tp}^{Texpo} Vy(t)dt$$

and $$Xp = \int_{Txs}^{Tp} Vx(t)dt + Xxs.$$

9. A method of manufacturing a device, the method comprising:

a scan exposure step of performing a scan exposure of a substrate, held by a substrate stage, in a first direction for each shot region of the substrate;

a developing step of developing the substrate having undergone the scan exposure; and a processing step of processing the developed substrate to manufacture the device, wherein the scan exposure step includes:

a first scan exposure step of performing a scan exposure of a first shot region of the substrate;

a first measuring step of measuring a surface position of a second shot region to undergo a scan exposure after the first scan exposure step while the substrate stage moves in a second direction, which is perpendicular to the first direction; and a second scan exposure step of performing the scan exposure of the second shot region based on a measurement result of the first measuring step, wherein the first shot region and the second shot region are arranged at different positions in the first direction and adjacent to each other in the second direction.

10. An exposure apparatus for performing a scan exposure of a substrate, held by a substrate stage, in a first direction for each shot region of the substrate, the apparatus comprising:

a detector configured to measure a surface position of a shot region of the substrate before the shot region reaches a region to be irradiated with exposure light; and a controller configured to control movement of the substrate stage in accordance with a profile defining the movement of the substrate stage, wherein the controller controls the movement of the substrate stage to perform a scan exposure of a first shot region of the substrate, wherein the detector measures a surface position of a second shot region to undergo a scan exposure after performing the scan exposure of the first shot region while the substrate stage moves in a second direction, which is perpendicular to the first direction, wherein the controller controls the movement of the substrate stage to perform the scan exposure of the second shot region based on a measurement result of the surface position of the second shot region, wherein the controller controls the movement of the substrate stage to perform a scan exposure of a third shot region of the substrate, wherein the detector measures a surface position of a fourth shot region to undergo a scan exposure after performing the scan exposure of the third shot region while the substrate stage moves in the second direction, wherein the controller controls the movement of the substrate stage to perform the scan exposure of the fourth shot region based on a measurement result of measuring the surface position of the fourth shot region, wherein the first shot region and the second shot region are arranged at an identical position in the first direction and adjacent to each other in the second direction, wherein the third shot region and the fourth shot region are arranged at different positions in the first direction and adjacent to each other in the second direction, and wherein a measurement position of the surface position is common among the second shot region and the fourth shot region.

11. The apparatus according to claim 10, wherein the profile is represented as a change over time of one of a velocity, an acceleration, or a jerk of the substrate stage.

12. A method of manufacturing a device, the method comprising:

a scan exposure step of performing a scan exposure of a substrate, held by a substrate stage, in a first direction for each shot region of the substrate;

a developing step of developing the substrate having undergone the scan exposure; and a processing step of processing the developed substrate to manufacture the device, wherein the scan exposure step includes:

a first scan exposure step of performing a scan exposure of a first shot region of the substrate;

a first measuring step of measuring a surface position of a second shot region to undergo a scan exposure after the first scan exposure step while the substrate stage moves in a second direction, which is perpendicular to the first direction;

a second scan exposure step of performing the scan exposure of the second shot region based on a measurement result of the first measuring step;

a third scan exposure step of performing a scan exposure of a third shot region of the substrate;

a second measuring step of measuring a surface position of a fourth shot region to undergo a scan exposure after the third scan exposure step while the substrate stage moves in the second direction; and a fourth scan exposure step of performing the scan exposure of the fourth shot region based on a measurement result of the second measuring step, wherein the first shot region and the second shot region are arranged at an identical position in the first direction and adjacent to each other in the second direction, wherein the third shot region and the fourth shot region are arranged at different positions in the first direction and adjacent to each other in the second direction, and wherein a measurement position of the surface position is common among the second shot region and the fourth shot region.

* * * * *